United States Patent [19]

Lemkey et al.

[11] Patent Number: 4,543,235

[45] Date of Patent: Sep. 24, 1985

[54] EUTECTIC SUPERALLOY COMPOSITIONS AND ARTICLES

[75] Inventors: Franklin D. Lemkey, Windsor, Conn.; Irving Machlin, Silver Spring, Md.

[73] Assignee: United Technologies Corporation, Hartford, Conn.

[21] Appl. No.: 421,675

[22] Filed: Sep. 22, 1982

[51] Int. Cl.$^4$ ............................................. C22C 19/05
[52] U.S. Cl. .................................... 420/443; 148/404; 148/410; 420/445
[58] Field of Search .................... 148/404, 410, 428; 420/443, 445

[56] References Cited

U.S. PATENT DOCUMENTS

| 3,124,452 | 3/1964 | Kraft | 75/135 |
|---|---|---|---|
| 3,554,817 | 1/1971 | Thompson | 148/32 |
| 3,564,940 | 2/1971 | Thompson et al. | 75/134 |
| 3,671,223 | 6/1972 | Thompson et al. | 75/122 |
| 3,793,010 | 2/1974 | Lemkey et al. | 75/170 |
| 4,012,241 | 3/1977 | Lemkey | 148/32 |
| 4,111,723 | 9/1978 | Lemkey | 148/32 |

FOREIGN PATENT DOCUMENTS 1484007 8/1977 United Kingdom .

OTHER PUBLICATIONS

"The Influence of Off-Axis Reinforcement on the Tensile Strength of an Ni–Al–Cr–C Eutectic Composite", by G. J. May, Journal of Materials Science 10 (1975), 77–82.

"The Fatigue Behavior of an Aligned Ni–Al–Cr–C Eutectic Alloy", by G. J. May, *Metallurgical Transactions*, vol. 6A, May 1975.

"Creep Behavior of a Ni–Ni$_3$Al–Cr$_3$C$_2$ Eutectic Composite", by Bullock et al., *Acta Metallurgica*, vol. 25, pp. 333–344, 1977.

"The Contribution of Fibre Reinforcement to the Tensile and Creep Strengths of $\gamma$–$\gamma'$–Cr$_3$C$_2$ Eutectic Composite", by Miles et al., Published in the Proceedings of the Second Conference on In Situ Composites, 1976.

"Effects of Alloying Additions and High Rate Solidification on the Mechanical and Oxidation Behavior of the Directionally Solidified $\gamma$–$\gamma'$–Cr$_3$C$_2$ Eutectic", by Bullock et al., Published in the Proceedings of the Third Conference on In Situ Composites, 1979.

*Primary Examiner*—R. Dean
*Attorney, Agent, or Firm*—Charles E. Sohl

[57] ABSTRACT

An improved eutectic superalloy composition is described. The eutectic composition upon solidification forms a gamma matrix, containing a substantial quantity of particles of the gamma prime phase, and containing about 12% by volume of aligned continuous chromium carbide fibers (Cr$_3$C$_2$). Material of this composition is provided with significantly improved mechanical properties and surface stability through the addition of approximately one atomic percent of the material selected from the group consisting of manganese, technetium and rhenium. Directionally solidified articles of this composition have utility as gas turbine engine components.

6 Claims, No Drawings

EUTECTIC SUPERALLOY COMPOSITIONS AND ARTICLES

The Government has rights in this invention pursuant to Contract No. N62269-79-C-0705 awarded by the Department of the Navy.

DESCRIPTION

1. Technical Field

This invention relates to the field of directionally solidified eutectic superalloys.

2. Background Art

It is known that certain eutectic superalloy compositions respond to proper directional solidification conditions to produce useful multiphase aligned microstructures as described in the patent to Kraft, U.S. Pat. No. 3,124,452. In a patent to Thompson, U.S. Pat. No. 3,554,817 there is described a pseudo binary eutectic alloy occurring between the intermetallic compounds $Ni_3Al$ and $Ni_3Cb$ which responds to plane front solidification to produce a casting characterized by an aligned lamellar microstructure. As so cast, this combination provides one of the strongest nickel base alloys known, although its ductility is less than that of most nickel base superalloys.

In a prior patent to Thompson and Lemkey, U.S. Pat. No. 3,564,940, there is described a class of compositions which solidify according to the monovariant eutectic reaction providing aligned polyphase structures including such systems as the ternary alloys identified as cobalt-chromium-carbon and nickel-aluminum-chromium. The advantage of compositions of this nature is that the desired microstructure can be achieved over a range of compositions in a given system. This provides a substantial increase in the freedom of selection of compositions permitting increased optimization of properties. In U.S. Pat. No. 3,671,223, the concept has been further developed to include those systems which solidify according to the multivariant eutectic reaction where two or more solid phases (N) crystallize simultaneously from the liquid consisting of (N+2) or more components.

U.S. Pat. No. 3,793,010 to Lemkey and Thompson discloses a eutectic article which consists of a gamma-gamma prime matrix with an aligned delta second phase.

U.S. Pat. No. 4,012,241 to Lemkey describes a eutectic which can be directionally solidified to produce a continuous gamma prime matrix containing alpha molybdenum fibers. U.S. Pat. No. 4,111,723 describes a related composition which produces a continuous gamma matrix containing alpha molybdenum fibers.

Considerable work has been done by the British on a eutectic composition which upon solidification, comprises a gamma matrix containing gamma prime particles and continuous fibers of $Cr_3C_2$. British Pat. No. 1,484,007 by Chadwick describes this material. Further publications included "Effects of Alloying Additions and High Rate Solidification on the Mechanical and Oxidation Behavior of the Directionally Solidified γ-γ'-$Cr_3C_2$ Eutectic" by E. Bullock et al published in *Proceedings of the Conference on In Situ Composites-III*, Ginn/Xerox Publishing Co., 191 Spring Street, Lexington, Mass. 02173. The work described in this paper apparently was performed subsequent to the conception and reduction to practice of the present invention.

DISCLOSURE OF THE INVENTION

Improved eutectic superalloy compositions and articles are described as is the method for producing the article. The article has a nominal composition of 6.9% Al, 12.2% Cr, 1.5% C, balance essentially nickel. The preceding figures are given as weight percent as are all other percentage values in this application, unless otherwise indicated. To this basic composition is added up to 1% Y, preferably 0.2%–0.7% Y. The further additions which constitute the present invention consists of from about 0.7 to about 1.4 atomic percent of an element selected from the group consisting of manganese, technetium and rhenium (Group VII-B of the Periodic Table). Material of this composition can be directionally solidified at a high rate to produce a structure consisting of a gamma matrix, containing discrete gamma prime particles (about 40% by volume or greater), and continuous $Cr_3C_2$ fibers. The additions of manganese, technetium and rhenium result in substantially improved mechanical properties and improved surface stability. These additions make the composition suitable for use as turbine blade material in gas turbine engines.

The foregoing, and other features and advantages of the present invention, will become more apparent from the following description.

BEST MODE FOR CARRYING OUT THE INVENTION.

The present invention relates to improved eutectic compositions and directionally solidiifed articles having utility at elevated temperatures by virtue of improved mechanical properties and enhanced surface stability at elevated temperatures. The present invention constitutes an improvement on the prior art composition as described, for example, in British Pat. No. 1,484,007 to Chadwick. The previously referenced article by E. Bullock et al describes the modification of this composition by the addition of minor amounts of yttrium. The present invention combines the basic composition with significant additions of manganese, technetium and rhenium, and preferably with the addition of an active element such as yttrium, and produces thereby, a composition which can be directionally solidified to produce an article having significantly enhanced utility.

The basic composition of the invention composition is 6.7–7.1 weight percent aluminum, 11.8–12.8 weight percent chromium, up to 1 weight percent yttrium (preferably 0.2–0.7 weight percent yttrium), balance essentially nickel. To this composition is added from about 0.7 to about 1.4 atomic percent of an element selected from the group consisting of manganese, technetium, rhenium, and mixtures thereof. In the case of rhenium alone, the amount required will be from about 2.5 to about 5 weight percent; in the case of manganese alone, the amount required will be from about 0.88 to about 1.6 weight percent; and in the case of technetium alone, the amount required will be from about 0.7 to about 1.4 weight percent.

The efficacy of manganese and rhenium as additions to gamma/gamma prime+$Cr_3C_2$ compositions has been experimentally confirmed. Technetium is mildly radioactive and this results in testing and application difficulties. Nonetheless, based on its position in the Periodic Table and atomic configuration, it is apparent that Tc will produce the beneficial results observed with manganese and rhenium.

Rhenium produces the most striking results. There is some evidence that manganese may produce a secondary benefit by reducing the effective chemical activity of yttrium, thereby reducing the reaction of yttrium with cermamic mold materials during processing. It is believed that combinations of manganese, rhenium and technetium a total amount of about 1 atomic percent will be useful, but this has not been verified.

Other elements, limited in number, might also be added or substituted including up to about 20% cobalt and/or up to about 10% iron, in replacement for a portion of the nickel. Yttrium may be replaced in whole or in part by any of the elements from Group III-B of the Periodic Table and the lanthanide series (and mixtures of these elements). Misch metal can also be used as a replacement for yttrium. It is also possible that a small amount (up to about 1% by weight) of silicon might be added for improved oxidation and corrosion resistance. Other elements such as titanium, zirconium, vanadium, molybdenum, tungsten, tantalum, and columbium should be avoided inasmuch as they are strong carbide formers, and if added in any significant amount, will interfere with the formation of the desired chromium carbide fibers.

Material of this composition can be cast and directionally solidified according to the well known techniques described in U.S. Pat. Nos. 3,124,452; 3,260,505; and 3,494,709 at a ratio of thermal gradient to rate of solidification of front movement in excess of about 2.25 $Cm^{-2} Hr$ to produce a desired structure. This permits solidification rates on the order of 25-37.5 cm per hour with commercial apparatus. Such solidification rates are higher than those which are usable with the prior art eutectic such as the gamma prime plus alpha type, i.e. less than 2 cm per hour. This higher rate solidification permits enhanced economic production, and also reduces the possible reaction of the molten material with a mold material.

The invention composition in directionally solidified form has been evaluated in terms of mechanical properties and surface stability (resistance to oxidation and corrosion). Results of these tests are summarized in Table I. The alloy described as MAR-M-200+hafnium is a commercial alloy having a nominal composition of 9% chromium, 10% cobalt, 12.5% tungsten, 1% columbium, 2% titanium, 5% aluminum, 0.15% carbon, 0.015% boron, 0.05% zirconium, 1.5% hafnium, balance nickel which is used in directionally solidified columnar grain form. This alloy is typical of an advanced alloy which is in commercial use. The alloy described as PWA 1480 is an advanced single crystal alloy which is just now coming into commercial use; its nominal composition is 10% chromium, 5% cobalt, 4% tungsten, 1.5% titanium, 5% aluminum, 12% tantalum, balance nickel. The alloy described as gamma/gamma prime+$Cr_3C_2$ unmodified is the basic composition described in the British patent to Chadwick (6.9% aluminum, 12.2% chromium, 1.7% carbon, balance nickel). The next three columns relate to modifications to this basic alloy. The composition which adds 0.5% yttrium to the basic composition does not form a part of the present application. The latter two alloys do form a part of the present invention and describe the performance of the basic composition modified with manganese and rhenium plus yttrium.

The first line in the Table shows the ratio of rupture stress density for the various alloys. Dividing by or normalizing to density is a commonly used technique in comparing alloys which are intended for use in rotating applications. It can be seen that the additions of manganese and rhenium substantially improve the density corrected rupture stress compared to that exhibited by the unmodified composition. The rhenium modified material is substantially superior to both the directionally solidified and single crystal conventional superalloy compositions. The sulfidation behavior of the various materials is described in the next line on the chart. It is apparent that the sulfidation behavior of the modified or invention alloys is substantially superior to that displayed by the prior art superalloys and the unmodified eutectic composition. The last lines of the Table describe the oxidation behavior, both in terms of weight change and in terms of depth of oxidation penetration in the sample. Only the rhenium plus yttrium modified composition was measured in these tests and its performance is seen to be substantially superior to that of the conventional superalloys and the unmodified eutectic compositions as well as the eutectic composition modified by the presence of yttrium alone.

A surprising and unexpected feature of the present invention is that the additions of rhenium and manganese (and quite likely technetium) segregate to the carbide fiber phase as well as the gamma matrix phase. The segregation to the carbide fiber phase was completely unexpected and is probably responsible for a large part of the improved mechanical properties. The segregation of the manganese and rhenium to the matrix phase is probably responsible for a large portion of the improved surface stability of the invention composition.

A further surprising microstructural feature is the thermal stability of the alloy, especially alloys containing 5 weight percent rhenium. The addition of rhenium to superalloys is known to generally improve elevated temperature mechanical properties, however, it has not been widely applied since in conventional superalloys, it almost always leads to the formation of undesirable brittle topologically complex phases, especially after long exposures at elevated temperatures. However, in the present composition, no evidence of these phases has been seen.

Thus, through the addition of an element selected from the group consisting of manganese, technetium and rhenium to the gamma/gamma prime+$Cr_3C_2$ eutectic composition has provided two compositions with substantially improved mechanical properties and substantially improved surface stability under conditions representative of those encountered in gas turbine engines. The compositions of the present invention will find particular utility as gas turbine engine components, particularly highly stressed rotating components such as turbine blades.

Although this invention has been shown and described with respect to detailed embodiments thereof, it will be understood by those skilled in the art that various changes in form and detail thereof may be made without departing from the spirit and scope of the claimed invention.

TABLE I

|  | MAR—M 200 + Hf (D.S.) (1) | PWA 1480 (S.C.) (2) | gamma/gamma prime + $Cr_3C_2$ UNMODIFIED (1) | gamma/gamma prime + $Cr_3C_2$ + 0.5% Y (1) | gamma/gamma prime + $Cr_3C_2$ + 1.5% Mn (1) | gamma/gamma prime + $Cr_3C_2$ + 5% Re + 0.5% Y (1) |
|---|---|---|---|---|---|---|
| 100 Hr Rupture Stress/Density In × $10^3$ 1900° F. (1038° C.) | 65 | 75 | 50 | 50 EST. | 71 | 94 |
| Cyclic Sulfidation Weight Change mg/cm$^2$ at 1650° F. (899° C.) with $Na_2SO_4$ after 200 hours | −183 | −77 | −110 | Not Measured | −9 | +15 |
| Cyclic Oxidation Weight Change mg/cm$^2$ at 2012° F. (1100° C.) after 200 hours | −409 | −58 | +85 (3) | +10 (3) | Not Measured | −1 |
| Cyclic Oxidation Penetration Depth at 2012° F. (1100° C.) (μm) after 200 hours | 240 | 62 | 122 | >50 (3) | Not Measured | 6 |

(1) Directionally Solidified
(2) Directionally Solidified Single Crystal
(3) From Bullock et al publication entitled "Effects of Alloying Additions and High Rate Solidification on the Mechanical and Oxidation Behavior of the Directionally Solidified γ-γ'-$Cr_3C_2$ Eutectic"

We claim:

1. In a eutectic superalloy composition, intended for use in directionally solidified form, consisting essentially of 6.7–7.1 weight percent aluminum, 11.8–12.8 weight percent chromium, 0–1 weight percent yttrium, about 1.5% carbon, balance nickel, the improvement which comprises: adding from about 0.7 to about 1.4 atomic percent of an element selected from the group consisting of manganese, technetium and rhenium, and mixtures thereof, whereby improved surface stability and mechanical properties result.

2. A composition as in claim 1 in which the yttrium content is replaced in whole or in part by a material selected from the group consisting of scandium, lanthanum, the lanthanide elements and Misch metal, and mixtures thereof.

3. A directionally solidified gas turbine engine component having a microstructure consisting of a continuous gamma (nickel solid solution) phase containing more than 40% of discontinuous gamma prime phase ($Ni_3X$, where X is predominantly Al) and said matrix further containing about 12 volume percent of continuous fibers having a nominal $Cr_3C_2$ composition, said component having a nominal composition of 6.9% aluminum, 12.2% chromium, 1.5% carbon, 0.2–0.7% yttrium, 0.7–1.4 atomic percent of an element selected from the group consisting of manganese, technetium and rhenium, and mixtures thereof, balance essentially nickel.

4. A turbine engine component as in claim 3 in which the yttrium content is replaced in whole or in part by a material selected from the group consisting of scandium, lanthanum, the lanthanide elements and Misch metal, and mixtures thereof.

5. A composition as in claim 1 in which the yttrium level is from 0.2–0.7 weight percent.

6. In a directionally solidified eutectic superalloy article having a nominal composition of 6.9% aluminum, 12.2% chromium, 1.5% carbon, 0–1% yttrium, balance essentially nickel, the improvement which comprises: 0.7–1.4 atomic percent of an element selected from the group consisting of manganese, technetium and rhenium, and mixtures thereof.

* * * * *